(12) United States Patent
Park et al.

(10) Patent No.: US 7,835,209 B2
(45) Date of Patent: Nov. 16, 2010

(54) METHOD AND APPARATUS FOR CONTROLLING READING LEVEL OF MEMORY CELL

(75) Inventors: Sung Chung Park, Daejeon (KR); Jun Jin Kong, Yongin-si (KR); Seung-Hwan Song, Incheon (KR); Dong Ku Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 499 days.

(21) Appl. No.: 12/003,545

(22) Filed: Dec. 28, 2007

(65) Prior Publication Data

US 2008/0320064 A1 Dec. 25, 2008

(30) Foreign Application Priority Data

Jun. 20, 2007 (KR) ...................... 10-2007-0060451

(51) Int. Cl.
*G11C 7/02* (2006.01)
(52) U.S. Cl. .............................. 365/210.1; 365/185.09; 365/185.18; 365/185.03
(58) Field of Classification Search .............. 365/210.1, 365/185.09, 185.22, 185.18, 185.03; 714/746, 714/752
See application file for complete search history.

(56) References Cited

U.S. PATENT DOCUMENTS

| | | | |
|---|---|---|---|
| 7,012,835 B2 | 3/2006 | Gonzalez et al. | |
| 7,173,852 B2 | 2/2007 | Gorobets et al. | |
| 7,224,607 B2 | 5/2007 | Gonzalez et al. | |
| 2006/0184859 A1* | 8/2006 | Jibry et al. | 714/769 |
| 2006/0285852 A1 | 12/2006 | Xi et al. | |
| 2008/0117685 A1* | 5/2008 | Syzdek et al. | 365/185.21 |
| 2008/0120526 A1* | 5/2008 | Eguchi et al. | 714/773 |

FOREIGN PATENT DOCUMENTS

| | | |
|---|---|---|
| EP | 1 622 277 | 2/2006 |
| JP | 03-253123 | 11/1991 |
| JP | 04-177917 | 6/1992 |
| JP | 08-263942 | 10/1996 |
| KR | 10-2003-0014722 | 2/2003 |
| KR | 10-2006-0088019 | 8/2006 |

OTHER PUBLICATIONS

Internation Search Report dated Apr. 14, 2008.
Korean Notice of Allowance dated May 30, 2008.

* cited by examiner

*Primary Examiner*—Tuan T Nguyen
*Assistant Examiner*—Toan Le
(74) *Attorney, Agent, or Firm*—Harness, Dickey & Pierce, P.L.C.

(57) ABSTRACT

A method and apparatus for controlling a reading level of a memory cell are provided. The method of controlling a reading level of a memory cell may include: receiving metric values calculated based on given voltage levels and reference levels; generating summed values for each of the reference levels by summing metric values corresponding to levels of a received signal from among the received metric values; selecting the reference level having the greatest value of the generated summed values from the reference levels; and controlling the reading level of the memory cell based on the selected reference level.

25 Claims, 8 Drawing Sheets

METHOD AND APPARATUS FOR CONTROLLING READING LEVEL OF MEMORY CELL

PRIORITY STATEMENT

This U.S. non-provisional application claims priority under 35 U.S.C. §119 to Korean Patent Application No. 10-2007-0060451, filed on Jun. 20, 2007, in the Korean Intellectual Property Office (KIPO), the entire contents of which are incorporated herein by reference.

BACKGROUND

1. Field

The example embodiments relate to a reading level, and more particularly, to a method and apparatus for controlling a reading level of a memory cell which may reduce data reading errors when reading a flash memory cell.

2. Description of Related Art

In a flash memory device, the critical voltage of a memory cell and a predetermined or given reading level may be compared, and data programmed in the memory cell may be read based on the critical voltage and the reading level.

As an example, in a memory cell of a four-bit, Multi Level Cell (MLC) method, the critical voltage of a memory cell may be compared to minimum fifteen predetermined or given reading levels to read data programmed in the memory cell.

However, when data reading errors for data read by a reading level increase, the error control code (ECC) decoding level, which may correct data reading errors, may need to be improved. Consequently, latency of a reading operation increases and the cost for an ECC decoder increase.

Additionally, the lifetime of apparatus and retention of stored data may be degraded due to the error increase.

A method and apparatus for controlling a reading level of a memory cell may address these issues.

SUMMARY

At least one example embodiment provides a method and apparatus for controlling a reading level of a memory cell which may select an optimum reading level and, thereby, may reduce data reading errors for data read from the memory cell.

At least one example embodiment may provide a method and apparatus for controlling a reading level of a memory cell which may reduce data reading errors for data read from the memory cell and, thereby, may use a low-level data error correction function and may reduce overall latency.

At least one example embodiment may provide a method and apparatus for controlling a reading level of a memory cell which may reduce data reading errors for data read from the memory cell and, thereby, may improve the lifetime of the apparatus and retention of stored data.

At least one example embodiment provides a method of controlling a reading level of a memory cell which may include: receiving metric values calculated based on predetermined or given voltage levels and reference levels; generating summed values with respect to each of the reference levels by summing metric values corresponding to levels of a received signal from among the received metric values; selecting, from the reference levels, the reference level having the greatest value of the generated summed values; and controlling the reading level of the memory cell based on the selected reference level.

In at least one example embodiment, the reading level may be controlled using control values, the control values being obtained by summing the selected reference level and predetermined or given starting voltages of conditional probability density functions (CPDFs) of the memory cell.

In at least one example embodiment, the metric values may be calculated based on the voltage levels, the reference levels, and predetermined or given starting voltages of CPDFs which may separate data of the memory cell.

In at least one example embodiment, metric values of the levels of the received signal and metric values of starting voltages corresponding to the levels of the received signal may be summed, and summed values may be generated with respect to each of the reference levels.

In at least one example embodiment, the starting voltages corresponding to the levels of the received signal may be generated by error control code (ECC) decoding the levels of the received signal.

In at least one example embodiment, the method of controlling a reading level of a memory cell may further include updating the selected reference level for each period corresponding to a number of predetermined or given received signals.

At least one example embodiment provides a method of controlling a reading level of a memory cell which may include: calculating a first set of metric values based on levels of a received signal and reference levels; using the first set of metric values to update a second set of metric values which may be calculated based on predetermined or given voltage levels and the reference levels; receiving the second set of updated metric values; generating summed values with respect to each of the reference levels by summing the second set of updated metric values with respect to the corresponding levels of the received signal; selecting, from the reference levels, the reference level having a greatest value of the generated summed values; and controlling the reading level of the memory cell based on the selected reference level.

At least one example embodiment provides an apparatus for controlling a reading level of a memory cell which may include: a memory cell; a receiving unit which receives metric values which may be calculated based on predetermined or given voltage levels and reference levels; a summation unit which may generate summed values with respect to each of the reference levels by summing metric values corresponding to levels of a received signal; a selection unit which selects the reference level having the greatest value of the generated summed values from the reference levels; and a control unit which controls the reading level of the memory cell based on the selected reference level.

At least one example embodiment, provides an apparatus for controlling a reading level of a memory cell which includes: a memory cell; an update calculation unit which may calculate metric values for updating based on levels of a received signal and reference levels; an updating unit which may update metric values, calculated based on predetermined or given voltage levels and the reference levels, using the metric values for updating; a receiving unit which may receive the updated metric values; a summation unit which may generate summed values with respect to each of the reference levels by summing updated metric values corresponding to the levels of the received signal from among the updated metric values; a selection unit which may select, from the reference levels, the reference level having the greatest value of the generated summed values; and a control unit which may control the reading level of the memory cell based on the selected reference level.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EMBODIMENTS

Figure 1:
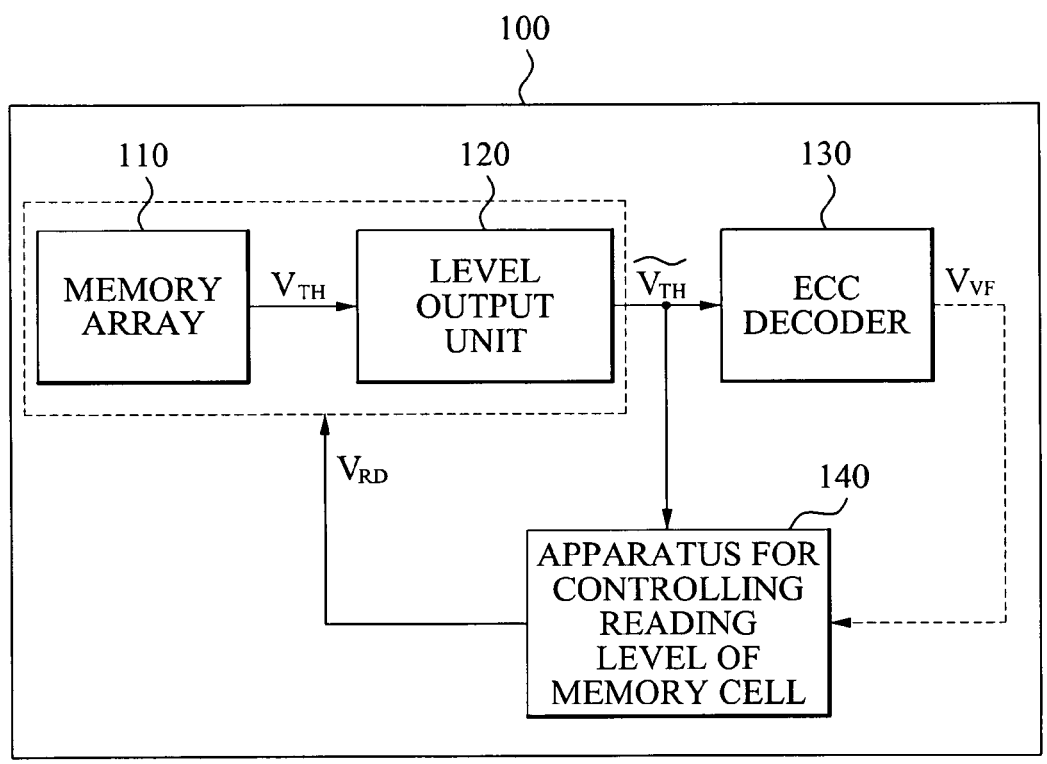
FIG. 1 is a block diagram illustrating a system including an apparatus for controlling a reading level of a memory cell according to at least one example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made in detail to the example embodiments, in the accompanying drawings, wherein like reference numerals refer to the like elements throughout.

FIG. 1 is a block diagram illustrating a system 100 including an apparatus for controlling a reading level of a memory cell according to at least one example embodiment.

Referring to FIG. 1, the system 100 including an apparatus for controlling a reading level of a memory cell may include a memory array 110, a level output unit 120, an error control code (ECC) decoder 130, and an apparatus for controlling a reading level of a memory cell 140.

The memory array 110 may include memory cells storing data, and may output critical voltages $V_{TH}$ of memory cells by a reading operation.

In at least one example embodiments, the memory array 110 may include a flash memory.

The memory array 110 may include a Multi Level Cell (MLC) flash memory, a Single Level Cell (SLC) flash memory, and the like.

The memory array 110 may include a NAND flash memory, a NOR flash memory, and the like.

The level output unit 120 may output a level of a received signal $\tilde{V}_{TH}$ with respect to the critical voltage based on a predetermined or given reading level or a reading level $V_{RD}$. The critical voltage may be outputted from the memory array 110. The reading level $V_{RD}$ may be controlled by the apparatus for controlling a reading level of a memory cell 140.

The level output unit 120 may include an analog-to-digital converter (e.g. second ADC), and may output the level of the received signal $\tilde{V}_{TH}$ with respect to the critical voltage via the second ADC. The second ADC may have a predetermined or given resolution.

The ECC decoder 130 ECC may decode the level of the received signal $\tilde{V}_{TH}$, which may be outputted from the level output unit 120, and may output a starting voltage $V_{VF}$ corresponding to the level of the received signal $\tilde{V}_{TH}$.

Here, the starting voltage may indicate a voltage where a conditional probability density function (CPDF) starts. The CPDF may separate data programmed in the memory cell. In a four-bit MLC memory cell, since programmed data may include 16 CPDFs from '0000' to '1111', 16 starting voltages may exist. Also, the starting voltages may be predetermined or given.

The apparatus for controlling a reading level of a memory cell 140 may control the reading level $V_{RD}$ based on the level of the received signal $\tilde{V}_{TH}$ which may be outputted from the level output unit 120.

The apparatus for controlling a reading level of a memory cell 140 may control the reading level $V_{RD}$ based on the level of the received signal $\tilde{V}_{TH}$ and the starting voltage $V_{VF}$ which may be outputted from the ECC decoder 130. The starting voltage $V_{VF}$ may correspond to the level of the received signal $\tilde{V}_{TH}$.

Figure 3:
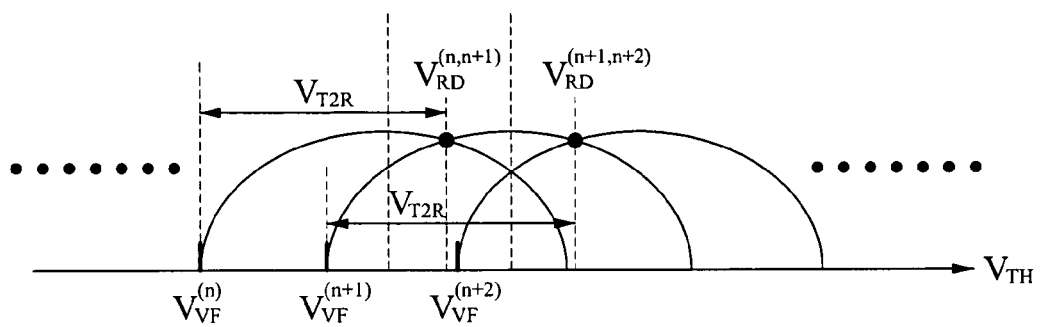
FIG. 3 is a diagram illustrating an example of an operation of the apparatus for controlling a reading level of a memory cell illustrated in FIG. 1.

The apparatus for controlling a reading level of a memory cell 140 may receive metric values calculated based on predetermined or given voltage levels and reference levels $V_{T2r}$ (shown in FIG. 3). Additionally, the apparatus for controlling a reading level of a memory cell 140 may select any one of the predetermined or given reference levels $V_{T2R}$ using the received metric values and, thereby, may control the reading level of the memory cell using the selected reference level.

The reference levels $V_{T2R}$ may be predetermined or given levels indicating a distance between the starting voltage of the CPDF and the reading level $V_{RD}$.

The voltage levels may be output levels of an ADC (e.g. first ADC) having a predetermined or given resolution. Although a number of voltage levels may depend on the resolution of the first ADC, and the resolution of the first ADC may vary depending on a situation, it may be preferable that the resolution of the first ADC is higher than the resolution of the second ADC included in the level output unit 120.

In this instance, the first ADC may be a low-resolution ADC, and have an arbitrary ADC output level. If the first ADC is a low-resolution ADC, a number of output levels of the ADC may be less than a predetermined or given value based on a number of CPDFs separating the data of the memory cell.

The low-resolution ADC may satisfy, the number of output levels of the ADC/(the number of bits which may be stored in a cell−1)<8.  [Equation 1]

As shown in Equation 1, the low-resolution ADC may vary depending on the numbers of bits which may be stored in the cell.

As an example, when the memory cell is a four-bit MLC memory cell, the low-resolution ADC may correspond to any one of a one-bit ADC, a two-bit ADC, a three-bit ADC, four-bit ADC, a five-bit ADC, and a six-bit ADC.

As another example, when the memory cell is a two-bit MLC memory cell, the low-resolution ADC may corresponds to any one of a one-bit ADC, a two-bit ADC, a three-bit ADC, and a four-bit ADC.

As still another example, when the memory cell is an SLC memory cell, the low-resolution ADC may correspond to a one-bit ADC or a two-bit ADC.

Figure 2:
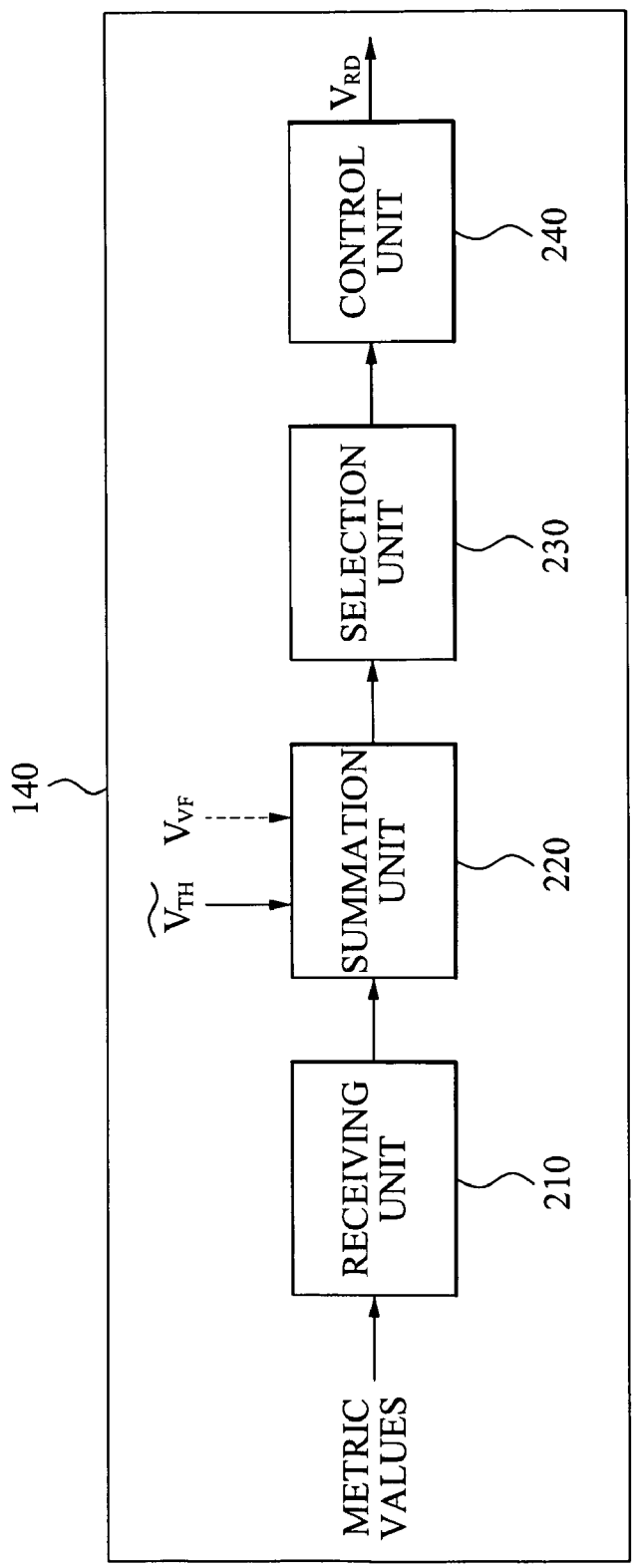
FIG. 2 is a block diagram illustrating a configuration of the apparatus for controlling a reading level of a memory cell illustrated in FIG. 1.

FIG. 2 is a block diagram illustrating a configuration of the apparatus for controlling a reading level of a memory cell 140 illustrated in FIG. 1 according to at least one example embodiment.

Referring to FIG. 2, the apparatus for controlling a reading level of a memory cell 140 may include a receiving unit 210, a summation unit 220, a selection unit 230, and a control unit 240.

The receiving unit 210 may receive metric values calculated based on predetermined or given voltage levels and reference levels.

The receiving unit 210 may receive the metric values calculated based on the voltage levels, the reference levels, and predetermined or given starting voltages of CPDFs which may separate data of the memory cell.

The receiving unit 210 may receive the metric values calculated based on the reference levels and differences between each of the starting voltages and each of the voltage levels corresponding to each of the starting voltages. As an example, when it is assumed that a CPDF corresponding to a starting voltage $V_{VF1}$ includes four voltage levels, i.e. V1, V2, V3, and V4, the differences between each of the starting voltages and each of the voltage levels corresponding to each of the starting voltages may be V1-$V_{VF1}$, V2-$V_{VF1}$, V3-$V_{VF1}$, and V4-$V_{VF1}$. Accordingly, the receiving unit 210 may receive the metric values calculated by the reference levels and V1-$V_{VF1}$, V2-$V_{VF1}$, V3-$V_{VF1}$, and V4-$V_{VF1}$. The starting voltages and the voltage levels corresponding to the starting voltages may vary depending on the CPDF. However, although the CPDF varies, the differences between each of the starting voltages and each of the voltage levels corresponding to each of the starting voltages may be the same. Accordingly, a number of metric values calculated may be reduced.

The receiving unit 210 may receive the metric values from a storage unit storing the calculated metric values.

The receiving unit 210 may receive the metric values from a logic circuit which outputs the metric values calculated using the voltage levels and the reference levels.

The receiving unit 210 may receive the metric values from an external storage unit storing the calculated metric values.

The receiving unit 210 may receive metric values obtained by summing predetermined or given metric values from among the calculated metric values, when a resolution of a first ADC is higher than a resolution of a second ADC, which will be described in detail with reference to FIG. 5. The second ADC is included in the level output unit 120.

The summation unit 220 may generate summed values with respect to each of the reference levels by summing metric values corresponding to levels of a received signal from among the received metric values.

The summation unit 220 may generate the summed values with respect to each of the reference levels by summing metric values of the levels of the received signal and metric values of starting voltages corresponding to the levels of the received signal.

In this instance, as an example, the summation unit 220 may generate four summed values with respect to each of the reference levels, for example, $V_{T2R1}$, $V_{T2R2}$, $V_{T2R3}$, and $V_{T2R4}$, by summing metric values corresponding to levels of a predetermined or given number of received signals, for example, 1000 received signals.

The selection unit 230 selects the reference level having the greatest value of the generated summed values. That is, the selection unit 230 may select, from the reference levels, the reference level, which enables the summed value to be the maximum summed value.

When the metric values are calculated based on the voltage levels and the reference levels, the reference level may be selected by, $$\hat{V}_{T2R} = \underset{V_{T2R}}{\mathrm{argmax}} \sum^{K} a(\hat{V}_{TH}, V_{T2R}).$$ [Equation 2]

Here, $\hat{V}_{T2R}$ may denote the selected reference level. K may denote the number of predetermined or given received signals. $\hat{V}_{TH}$ may denote the level of the received signal. $V_{T2R}$ may denote predetermined or given reference levels. The expression '$a(\tilde{V}_{TH}, V_{T2R})$' may denote a metric value corresponding to $\tilde{V}_{TH}$ and $V_{T2R}$.

When the metric values are calculated based on the voltage levels, the reference levels, and the predetermined or given starting voltages of the CPDFs which may be separating the data of the memory cell, the reference level may be selected by, $$\hat{V}_{T2R} = \underset{V_{T2R}}{\arg\max} \sum^{K} a(\tilde{V}_{TH}, V_{VF}, V_{T2R}). \quad \text{[Equation 3]}$$

Referring to the equation above, $\hat{V}_{T2R}$ may denote the selected reference level. K may denote the number of predetermined or given received signals. $\tilde{V}_{TH}$ may denote the level of the received signal. $V_{VF}$ may denote the starting voltage of the CPDF, which corresponds to the level of the received signal. $V_{T2R}$ may denote the predetermined or given reference levels. The expression '$a(\tilde{V}_{TH}, V_{VF}, V_{T2R})$' may denote a metric value corresponding to $\tilde{V}_{TH}$, the $V_{VF}$, and $V_{T2R}$.

The selection unit 230 may select a reference level for each period, where a period corresponds to a predetermined or given number of received signals.

The selection unit 230 may select the reference level based on summed values of a current period and summed values of up to the current period. For example, if in a current period, the number of received signals is 1000 and the number of received signals up to the current period is 9000, the selection unit 230 may select a reference level having the greatest value, after the summed values of the current period and the summed values of up to the current period are multiplied by a predetermined or given weight, for example, a weight of 9:1, respectively.

The control unit 240 may control the reading level of the memory cell based on the selected reference level.

The control unit 240 may control the reading level of the memory cell using control values. The control values may be obtained by summing the reference level, selected by the selection unit 230, and the starting voltages of the CPDFs. That is, the control unit 240 may know the starting voltage of each of the CPDFs, accordingly, the control unit 240 may control the reading level of the memory cell using the control values obtained by summing each of the starting voltages and the reference level which may reduce an error occurring due to a read operation.

The control unit 240 may control the reading level of the memory cell using, $$V_{RD}^{(n,n+1)} = V_{VF}^{(n)} + \hat{V}_{T2R}. \quad \text{[Equation 4]}$$

Here, $V_{RD}^{(n,n+1)}$ may denote a reading level separating an $n^{th}$ CPDF and an $n+1^{th}$ CPDF. $V_{VF}^{(n)}$ may denote a starting voltage of the $n^{th}$ CPDF. $\hat{V}_{T2R}$ may denote the selected reference level.

FIG. 3 is a diagram illustrating the operation of the apparatus for controlling a reading level of a memory cell 140 illustrated in FIG. 1 according to at least one example embodiment.

Referring to FIG. 3, operations of the selection unit 230 and the control unit 240 are described in greater detail. The reference level $V_{T2R}$ having the greatest value may be selected by the selection unit 230 and the control unit 240 may consider a first value as a reading level $V_{RD}^{(n,n+1)}$ which may differentiate the $n^{th}$ CPDF and the $n+1^{th}$ CPDF. The first value may be obtained by summing a starting voltage of the $n^{th}$ CPDF, that is, $V_{VF}^{(n)}$, and the selected reference level $V_{T2R}$. Also, the control unit 240 may consider a second value as a reading level $V_{RD}^{(n+1,n+2)}$ which may differentiate the $n+1^{th}$ CPDF and an $n+2^{th}$ CPDF. The second value may be obtained by summing a starting voltage of the $n+1^{th}$ CPDF, $V_{VF}^{(n+1)}$, and the selected reference level $V_{T2R}$.

As described above, the apparatus for controlling a reading level of a memory cell 140 according to at least one example embodiment may control the reading level to reduce an error which may occur when reading data from a memory, and thus data may be accurately obtained.

Figure 4:
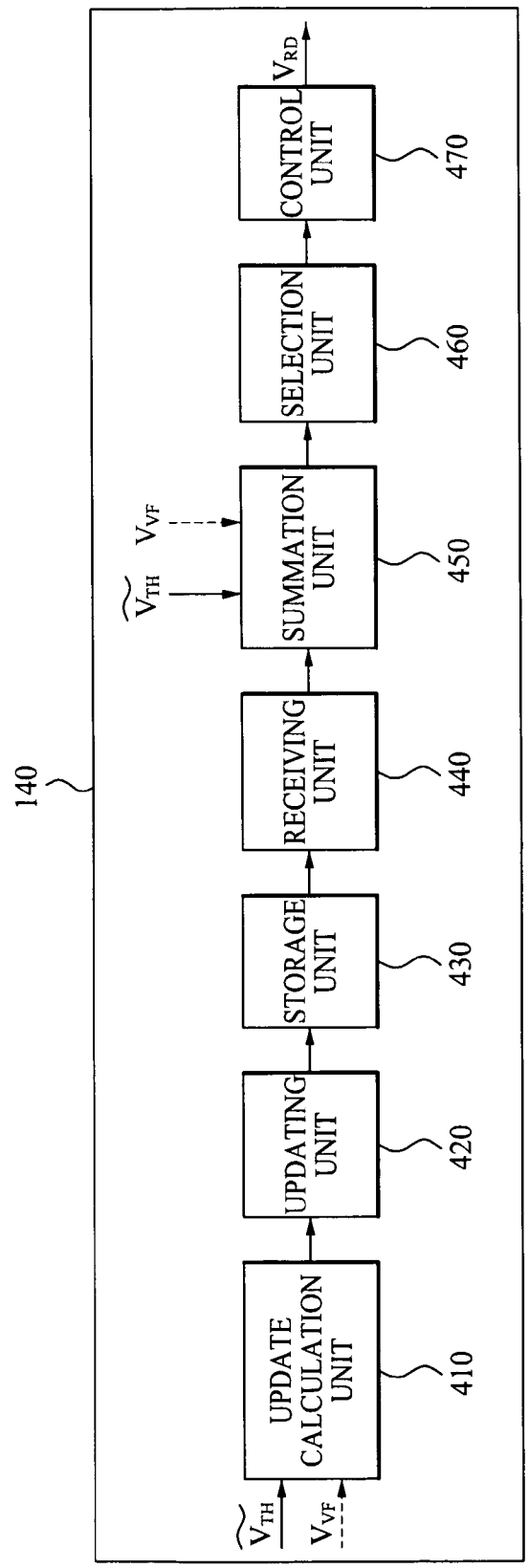
FIG. 4 is a block diagram illustrating another configuration of the apparatus for controlling a reading level of a memory cell illustrated in FIG. 1.

FIG. 4 is a block diagram illustrating another configuration of the apparatus for controlling a reading level of a memory cell 140 illustrated in FIG. 1 according to at least one example embodiment.

Referring to FIG. 4, the apparatus for controlling a reading level of a memory cell may include an update calculation unit 410, an updating unit 420, a storage unit 430, a receiving unit 440, a summation unit 450, a selection unit 460, and a control unit 470.

The update calculation unit 410 may calculate metric values for updating based on levels of a received signal $\tilde{V}_{TH}$. The levels of the received signal $\tilde{V}_{TH}$ may be outputted from the level output unit 120.

In this instance, the update calculation unit 410 may calculate the metric values for updating based on levels of a received signal and reference levels. The reference levels may correspond to levels of a received signal, and the levels of a received signal may be outputted from the ECC decoder 130.

The updating unit 420 may receive a first set of metric values, which may be calculated by the update calculation unit 410. Additionally, using the first set of received metric values, the updating unit 420 may update a second set of metric values, which may be stored in the storage unit 430.

Specifically, the updating unit 420 may use the first set of metric values to update the second set of metric values, which may be calculated based on predetermined or given voltage levels and the reference levels and then stored in the storage unit 430.

The receiving unit 440 may receive the updated metric values from the storage unit 430.

The summation unit 450 may receive the levels of the received signal $\tilde{V}_{TH}$, which may be outputted from the level output unit 120, and may sum metric values corresponding to the levels of the received signal $\tilde{V}_{TH}$ from among the updated metric values received from the receiving unit 440. Also, the summation unit 450 may generate summed values with respect to each of the reference levels.

In this instance, the summation unit 450 may receive starting voltages corresponding to the levels of the received signal $\tilde{V}_{TH}$, which may be outputted from the level output unit 120, and the levels of the received signal $V_{VF}$, which may be outputted from the ECC decoder 130. Also, the summation unit 450 may sum metric values of levels of the received signal and metric values of starting voltages corresponding to the levels of the received signal from among the updated metric values which may be received from the receiving unit 440. Accordingly, the summation unit 450 may generate the summed values with respect to each of the reference levels.

The selection unit 460 may select a reference level having the greatest value of the generated summed values. That is, the selection unit 460 may select, from the reference levels, the reference level which enables the summed value to be a maximum summed value. The summed values may be generated by the summation unit 450.

The selection unit 460 may update the selected reference level for each period corresponding to a number of predetermined or given received signals.

The selection unit 460 may update the selected reference level based on summed values of a current period and summed values of up to a previous period with respect to each of the reference levels.

The control unit 470 may control the reading level of the memory cell based on the selected reference level. Specifically, the control unit 470 may controls the reading level of the memory cell based on control values. The control values may be obtained by summing starting voltages of CPDFs, separating data of the memory cell, and the reference level selected by the selection unit 460.

Figure 5:
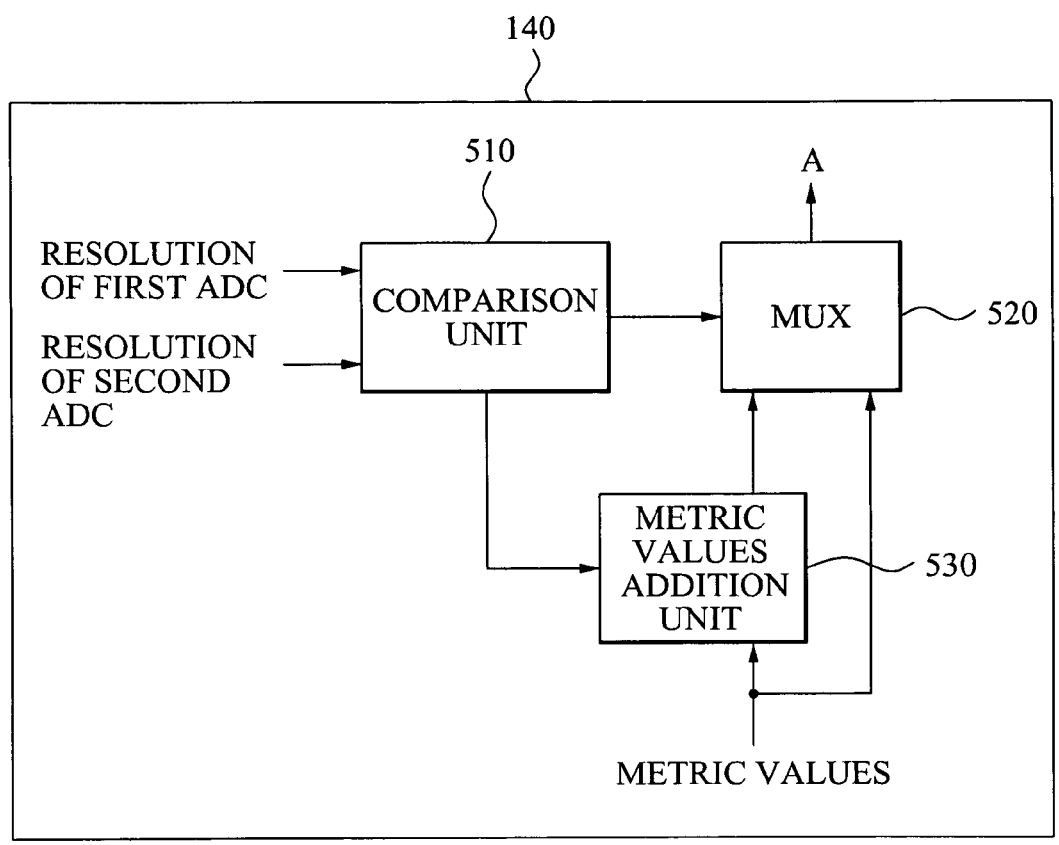
FIG. 5 is a block diagram illustrating still another configuration of the apparatus for controlling a reading level of a memory cell illustrated in FIG. 1.

FIG. 5 is a block diagram illustrating another configuration of the apparatus for controlling a reading level of a memory cell 140 illustrated in FIG. 1 according to at least one example embodiment.

Using the configuration depicted in FIG. 5, a disadvantage, caused by a difference between the resolution of a first ADC and the resolution of a second ADC, may be overcome. The resolution of the first ADC may be used to calculate metric values, and the second ADC may be included in a level output unit 120 which may output a level of a received signal.

Referring to FIG. 5, the apparatus for controlling a reading level of a memory cell 140 may further include a comparison unit 510, a multiplexer (MUX) 520, and a metric value addition unit 530.

The comparison unit 510 may compare the resolution of the first ADC and the resolution of the second ADC. Specifically, the comparison unit 510 may output a control signal with respect to whether to use metric values, which may be calculated based on voltage levels and reference levels, or summed metric values, by comparing the two resolutions.

The metric values addition unit 530 may receive metric values, for example, metric values which may be stored in a storage unit or metric values which may be outputted from a logic circuit. Additionally, the metric values addition unit 530 may sum the received metric values based on the control signal which may be outputted from the comparison unit 510.

As an example, when receiving a control signal performing an add operation of two metric values from the comparison unit 510, the metric values addition unit 530 may sum two predetermined or given metric values from among the received metric values, and output the summed metric values to the MUX 520.

The metric values addition unit 530 may sum metric values based on the control signal outputted from the comparison unit 510. A given control signal may correspond to a number of metric values to sum. Additionally, the metric values addition unit 530 may output the summed metric values. Accordingly, the metric values addition unit 530 may sum the two metric values or, depending on the control signal, sum four metric values. As an example, when the difference between the resolution of the second ADC and the resolution of the first ADC corresponds to two-bits, and when the first ADC, which may be used to calculate the metric values, is a six-bit ADC and the second ADC is a four-bit ADC, the metric values addition unit 530 may receive a control signal with respect to a two-bit difference from the comparison unit 510. Also, the metric values addition unit 530 may sum and output four metric values corresponding to the control signal.

Although the metric values addition unit 530 may be configured to receive the control signal from the comparison unit 510, the metric values addition unit 530 may be configured to receive the metric values and sum a predetermined or given number of metric values without receiving the control signal from the comparison unit 510.

The MUX 520 may output any one of the metric values which may have been outputted from the logic circuit or stored in the storage unit and the summed metric values, which may be outputted from the metric values addition unit 530, based on the control signal which may be outputted from the comparison unit 510. Also, the MUX 520 may provide the outputted metric value to a receiving unit.

Specifically, when the resolution of the first ADC and the resolution of the second ADC are equal, the MUX 520 may output the metric values which may have been outputted from the logic circuit or stored in the storage unit. Also, when the resolution of the first ADC and the resolution of the second ADC are different, the MUX 520 may output the summed metric values.

When the metric values addition unit 530 is configured to be able to output the received metric values based on the control signal outputted from the comparison unit 510 or output the summed metric values, the MUX 520 is may not be required.

Figure 6:
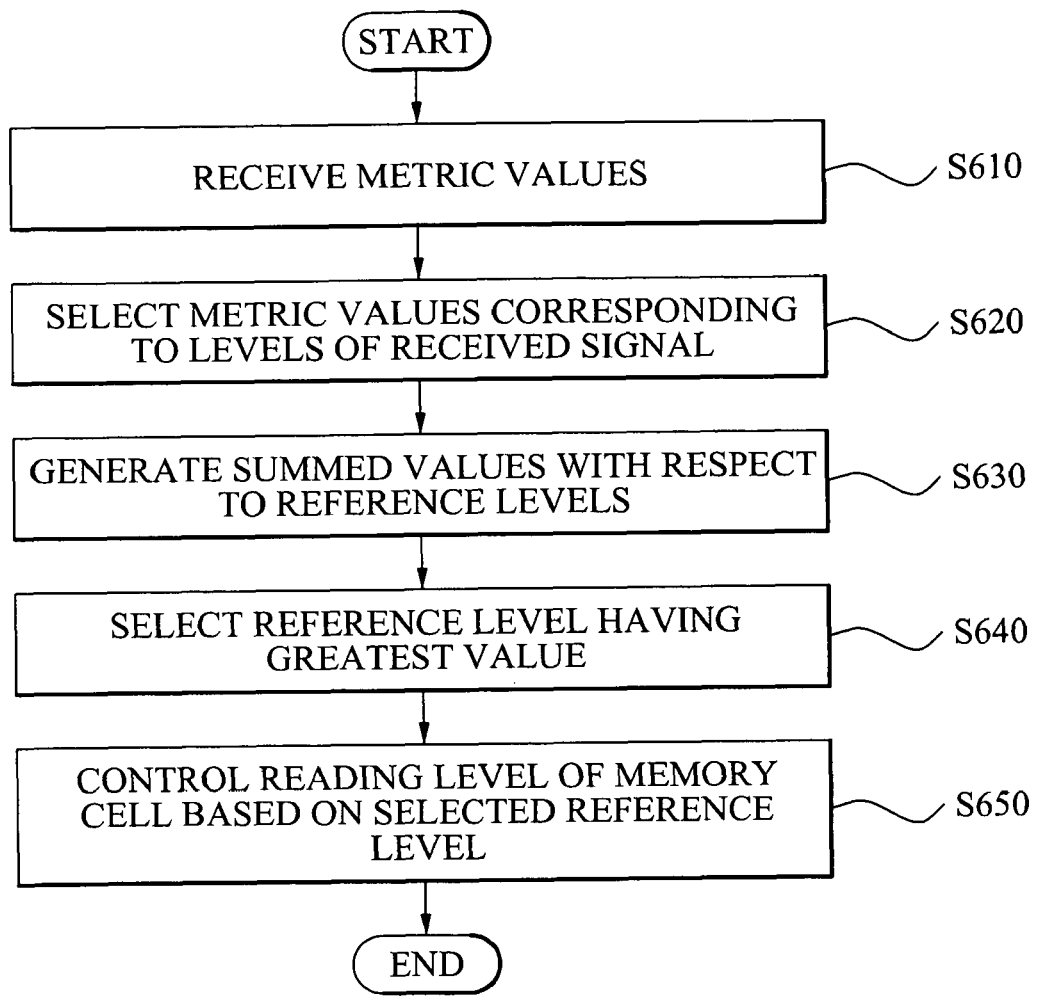
FIG. 6 is a flowchart illustrating a method of controlling a reading level of a memory cell according to at least one example embodiment.

FIG. 6 is a flowchart illustrating a method of controlling a reading level of a memory cell according to at least one example embodiment.

Referring to FIG. 6, in operation S610, the method of controlling a reading level of a memory cell may receive metric values calculated based on predetermined or given voltage levels and reference levels.

The metric values may be calculated based on the voltage levels, the reference levels, and starting voltages of CPDFs which may separate data of the memory cell.

The metric values may be calculated based on the reference levels and differences between each of the starting voltages and each of the corresponding voltage levels.

The metric values may be received from a storage unit which may store the calculated metric values.

The metric values may be received from a logic circuit which may calculate and output the metric values based on the voltage levels and the reference levels.

Here, the voltage levels may correspond to output levels of a first ADC having a predetermined or given resolution. The first ADC may be a low-resolution ADC having a number of output levels of the ADC. The number of output levels of the first ADC may be less than a predetermined or given value based on a number of CPDFs.

The memory cell may include a flash memory cell. The flash memory cell may include a memory cell of an MLC method and a memory cell of an SLC method.

In operation S620, the metric values may be received and metric values corresponding to levels of a received signal may be selected from the received metric values. In operation S630, summed values with respect to each of the reference levels may be generated by summing the selected metric values.

The summed values with respect to each of the reference levels may be generated by summing metric values of the levels of the received signal and metric values of the corresponding starting voltages.

Here, the starting voltages corresponding to the levels of the received signal may be generated by ECC decoding the levels of the received signal.

In operation S640, the summed values may be generated and a reference level having the greatest value of the generated summed values may be selected. That is, the reference level, which may enable the summed value to be a maximum summed value, may be selected from the reference levels.

The selected reference level may be updated for each period corresponding to a number of predetermined or given received signals.

The selected reference level may be updated based on summed values of a current period and summed values of up to a previous period with respect to each of the reference levels.

In operation S650, the reference level may be selected and the reading level of the memory cell may be controlled based on the selected reference level.

The reading level of the memory cell may be controlled by control values. The control values may be obtained by summing the selected reference level and predetermined or given starting voltages of the CPDFs which may separate data of the memory cell.

Figure 7:
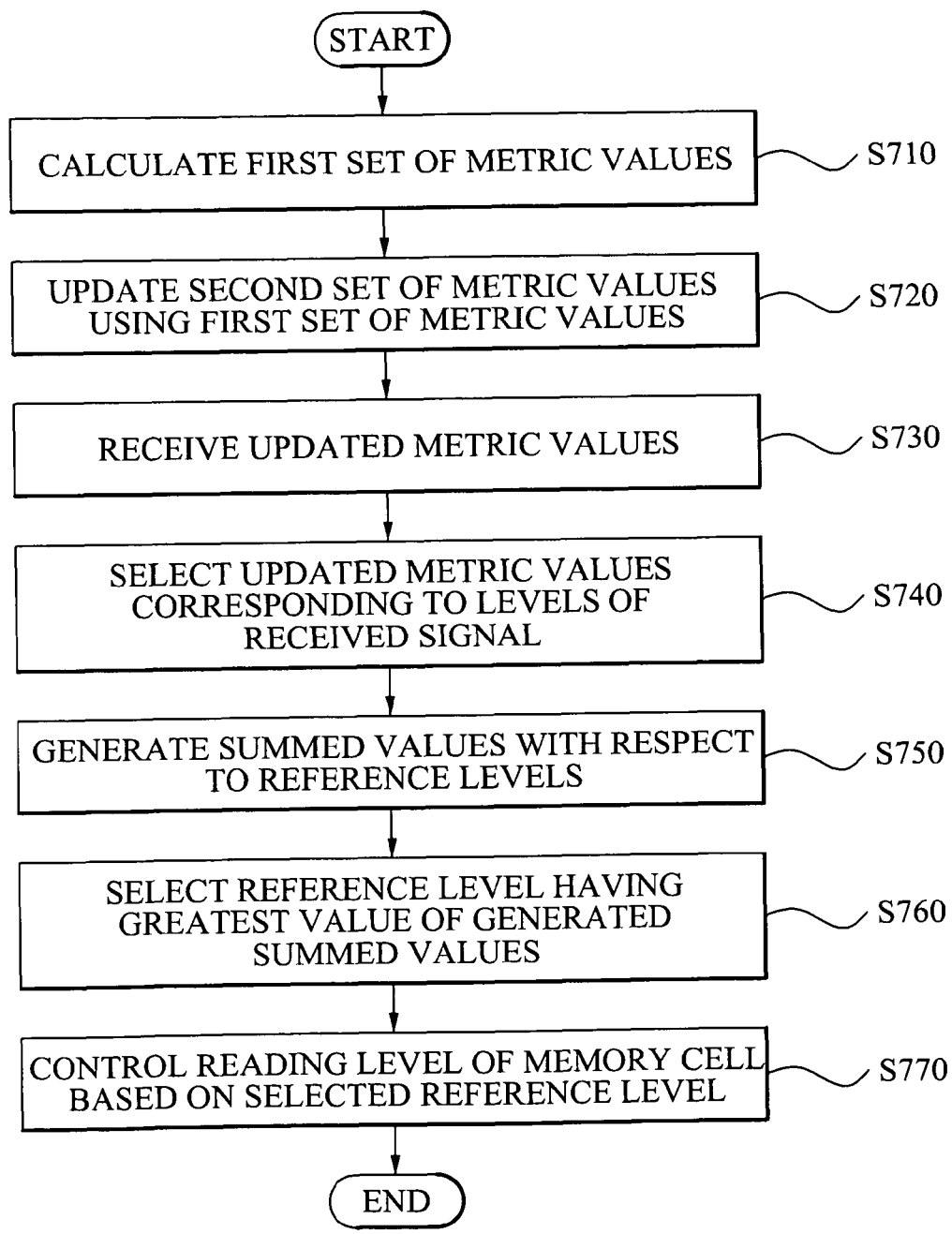
FIG. 7 is a flowchart illustrating another method of controlling a reading level of a memory cell according to at least one example embodiment.

FIG. 7 is a flowchart illustrating a method of controlling a reading level of a memory cell according to at least one example embodiment.

Referring to FIG. 7, in operation S710, the method of controlling a reading level of a memory cell may calculate the first set of metric values, which may be used for updating, based on levels of a received signal.

The first set of metric values, which may be used for updating, may be calculated based on the levels of the received signal and reference levels. The reference levels may be outputted by ECC decoding the levels of the received signal.

In operation S720, the first set of metric values, which may be used for updating, may be calculated and may be used to update the second set of metric values.

For example, the second set of metric values, which may be stored in the storage unit, may be updated by updating the first set of metric values to the storage unit.

The metric values stored in the storage unit may be calculated based on predetermined or given voltage levels and the reference levels, or based on the voltage levels, the reference levels, and starting voltages of CPDFs, which may separate data of the memory cell.

In operation S730, the updated metric values may be received when the metric values are updated. In operation S740, metric values corresponding to the levels of the received signal may be selected from the received updated metric values. In operation S750, summed values with respect to each of the reference levels may be generated by summing the selected metric values.

The summed values with respect to each of the reference levels may be generated by summing metric values of the levels of the received signal and metric values of corresponding starting voltages.

The starting voltages corresponding to the levels of the received signal of the CPDFs may be generated by ECC decoding the levels of the received signal.

In operation S760, the summed values may be generated and a reference level having the greatest value of the generated summed values may be selected.

The selected reference level may be updated for each period corresponding to a number of predetermined or given received signals.

The selected reference level may be updated based on summed values of a current period and summed values of up to a previous period with respect to each of the reference levels. For example, when a proportion of a number of received signals up to the previous period to a number of received signals of the current period is 9:1, the summed values of the current period and the summed values of up to the previous period may be multiplied by a predetermined or given weight, for example, a weight of 9:1, respectively and the reference level having the highest level may be selected.

In operation S770, the reference level may be selected and the reading level of the memory cell may be controlled based on the selected memory cell.

In this instance, the reading level of the memory cell may be controlled by control values. The control values may be obtained by summing the selected reference level and starting voltages of CPDFs separating data of the memory cell.

Figure 8:
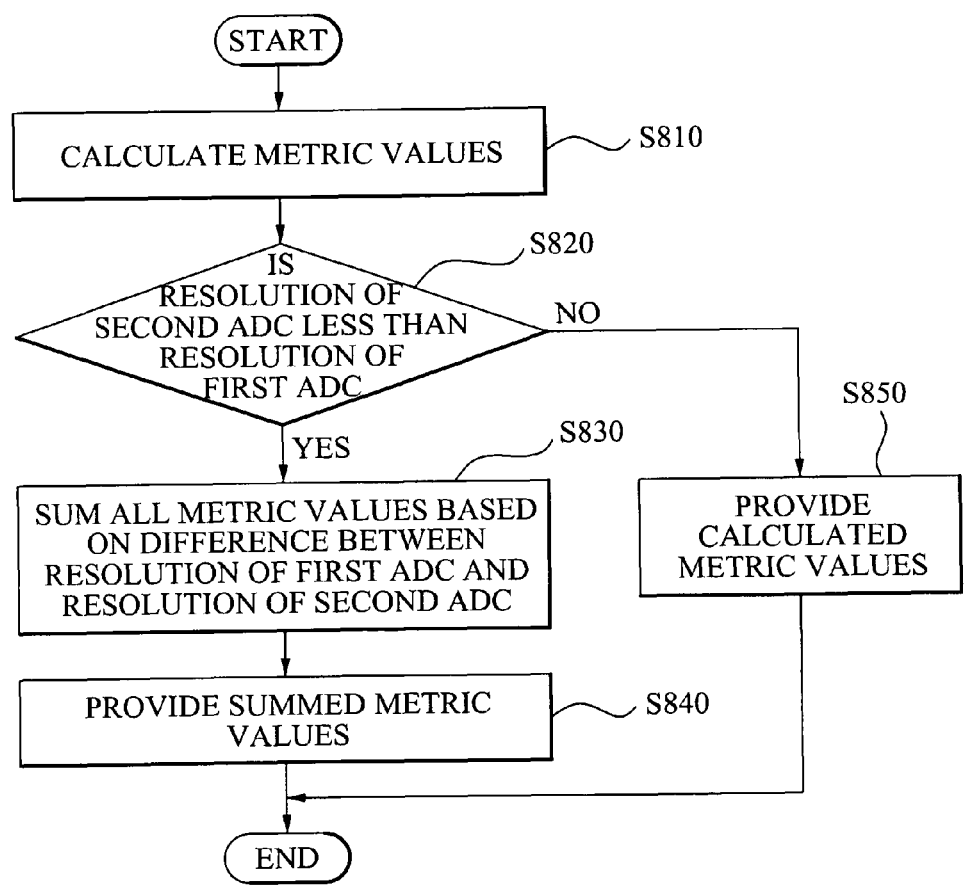
FIG. 8 is a flowchart illustrating an operation of generating metric values in a method of controlling a reading level of a memory cell according to at least one example embodiment.

FIG. 8 is a flowchart illustrating an operation of generating metric values in a method of controlling a reading level of a memory cell according to at least one example embodiment.

The operation of generating metric values, illustrated in FIG. 8, may overcome a disadvantage which may be caused by a difference between the resolution of a first ADC and the resolution of a second ADC. The resolution of the first ADC may be used to calculate metric values, and may correspond to voltage levels. Additionally, the second ADC may output a level of a received signal.

Referring to FIG. 8, in operation S810, metric values may be calculated based on voltage levels to provide the metric values, that is, output levels of the first ADC, and reference levels.

The calculated metric values may be stored in a storage unit.

In operation S820, whether the resolution of the second ADC is lower than the resolution of the first ADC may be determined by comparing the resolution of the first ADC and the resolution of the second ADC in order to determine whether to provide calculated metric values.

As a result of the determining in operation S820, when the resolution of the second ADC is not lower than the resolution of the first ADC, that is, the resolution of the second ADC is the same as the resolution of the first ADC, the metric values calculated in operation S810 may be provided in operation S850.

Conversely, when the resolution of the second ADC is lower than the resolution of the first ADC, the metric values calculated in operation S810 may be summed based on the difference between the resolution of the second ADC and the resolution of the first ADC in operation S830. In operation S840, the summed metric values may be provided.

The method of controlling a reading level of a memory cell ac cording to the example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of the example embodiments, or they may be of the kind well-known and available to those having skill in the computer software arts. Examples of computer-readable media may include, but are not limited to, magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions may include, but are not limited to, both machine code, such as produced by a compiler, and files containing higher level code that may be executed by the computer using an interpreter. The described hardware devices may be configured to act as one or more software modules in order to perform the operations of the example embodiments.

According to the above-described example embodiments, a method and apparatus for controlling a reading level of a memory cell may select an optimum reading level, and thereby may reduce data reading errors for data read from the memory cell.

Additionally, according to the at least one example embodiment, a method and apparatus for controlling a reading level of a memory cell may reduce data reading errors for data read from the memory cell and, thereby, may use a low-level data error correction function and reduce overall latency.

Furthermore, according to at least one example embodiment, a method and apparatus for controlling a reading level of a memory cell may reduce data reading errors for data read from the memory cell, and thereby may improve a lifetime of the apparatus and retention of stored data.

Although a few example embodiments have been shown and described, the example embodiments are not limited to the described embodiments. Instead, it should be appreciated by those skilled in the art that changes may be made to these embodiments without departing from the principles and spirit of the example embodiments, the scope of which is defined by the claims and their equivalents.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of controlling a reading level of a memory cell, the method including:
    receiving metric values calculated based on voltage levels and reference levels;
    generating summed values with respect to each of the reference levels by summing metric values where, the metric values correspond to levels of a received signal;
    selecting a reference level having a greatest value of the generated summed values from the reference levels; and
    controlling the reading level of the memory cell based on the selected reference level.

2. The method of claim 1, wherein the controlling of the reading level includes using control values, the control values being obtained by summing the selected reference level and starting voltages of conditional probability density functions (CPDFs) of the memory cell.

3. The method of claim 1, wherein the metric values are calculated based on the voltage levels, the reference levels, and starting voltages of CPDFs.

4. The method of claim 3, wherein the metric values are calculated based on the reference levels and differences between each of the starting voltages and each of the voltage levels corresponding to each of the starting voltages.

5. The method of claim 3, wherein the generating of the summed values includes summing metric values of the levels of the received signal and metric values of starting voltages corresponding to the levels of the received signal, and generating the summed values for each of the reference levels.

6. The method of claim 5, wherein the starting voltages corresponding to the levels of the received signal are generated by error control code (ECC) decoding the levels of the received signal.

7. The method of claim 1, further comprising:
    selecting a reference level for each period, where a period corresponds to a number of received signals.

8. The method of claim 7, wherein the selecting of a reference level includes selecting a reference level based on summed values of a current period and summed values of up to the current period with respect to each of the reference levels.

9. The method of claim 1, wherein the voltage levels correspond to output levels of a first analog-to-digital converter (ADC) having a given resolution.

10. The method of claim 9, wherein the first ADC is a low-resolution ADC having a number of output levels, the number of output levels being less than a given value based on a number of bits which may be stored in the memory cell.

11. The method of claim 9, further comprising:
    comparing a resolution of the first ADC and a resolution of a second ADC, which outputs the levels of the received signal; and
    summing all metric values when the resolution of the second ADC is lower than the resolution of the first ADC, wherein the receiving of the metric values includes receiving the summed metric values.

12. The method of claim 1, wherein the receiving of the metric values includes receiving the metric values from a storage unit storing the calculated metric values.

13. The method of claim 1, wherein the memory cell includes a flash memory cell.

14. The method of claim 13, wherein the memory cell includes a Multi Level Cell (MLC) memory cell.

15. A method of controlling a reading level of a memory cell, the method comprising:
    calculating a first set of metric values based on levels of a received signal and reference levels;
    using the first set of metric values to update a second set of metric values, where the second set of metric values are calculated based on given voltage levels and the reference levels;
    receiving the updated metric values;
    generating summed values with respect to each of the reference levels by summing the updated metric values, where the updated metric values correspond to the levels of the received signal;
    selecting a reference level having a greatest value of the generated summed values from the reference levels; and
    controlling the reading level of the memory cell based on the selected reference level.

16. The method of claim 15, wherein the calculating of the first set of metric values includes calculating the first set of metric values based on the levels of the received signal, the reference levels, and starting voltages of CPDFs separating data of the memory cell, where the data of the memory cell corresponds to the levels of the received signal, and
    the updating of the second set of metric values includes updating the second set of metric values using the first set of metric values, where the second set of metric values are calculated based on the voltage levels, the reference levels, and the starting voltages of the CPDFs separating the data of the memory cell.

17. The method of claim 16, wherein the starting voltages of the CPDFs are generated by ECC decoding the levels of the received signal.

18. A computer-readable recording medium storing a program for implementing a method of controlling a reading level of a memory cell, the method including:
    receiving metric values calculated based on given voltage levels and reference levels;
    generating summed values for each of the reference levels by summing metric values corresponding to levels of a received signal;
    selecting a reference level having a greatest value of the generated summed values from the reference levels; and controlling the reading level of the memory cell based on the selected reference level.

19. An apparatus for controlling a reading level of a memory cell, the apparatus comprising:
a memory cell;
a receiving unit which receives metric values calculated based on given voltage levels and reference levels;
a summation unit which generates summed values with respect to each of the reference levels by summing the received metric values corresponding to levels of a received signal;
a selection unit which selects a reference level having a greatest value of the generated summed values from the reference levels; and
a control unit which controls the reading level of the memory cell based on the selected reference level.

20. The apparatus of claim 19, further comprising:
a first ADC, wherein the voltage levels correspond to output levels of the first ADC.

21. The apparatus of claim 20, further comprising:
a comparison unit which compares a resolution of the first ADC and a resolution of a second ADC which outputs the levels of the received signal; and
a metric values addition unit which sums all metric values when the resolution of the second ADC is lower than the resolution of the first ADC,
wherein the receiving unit receives the summed metric values.

22. The apparatus of claim 19, further including:
a storage unit, wherein the receiving unit receives the metric values from a storage unit storing the calculated metric values.

23. The apparatus of claim 19, wherein the memory cell includes a flash memory cell, wherein the flash memory cell is one from the group of a Multi Level Cell (MLC) memory cell and a Single Level Cell (SLC) memory cell.

24. An apparatus of controlling a reading level of a memory cell, the apparatus comprising:
a memory cell;
an update calculation unit which calculates a first set of metric values based on levels of a received signal and reference levels;
an updating unit which uses the first set of metric values to update a second set of metric values, where the second set of metric values are calculated based on given voltage levels and the reference levels;
a receiving unit which receives the updated metric values;
a summation unit which generates summed values for each of the reference levels by summing the updated metric values, where the updated values correspond to the levels of the received signal;
a selection unit which selects a reference level having a greatest value of the generated summed values from the reference levels; and
a control unit which controls the reading level of the memory cell based on the selected reference level.

25. The apparatus of claim 24, further including:
an ECC decoder wherein, the second set of metric values are calculated based on the voltage levels, the reference levels, and the starting voltages of the CPDFs separating the data of the memory cell, and wherein the ECC decoder generates the starting voltages of the CPDF by decoding the levels of the received signal.

* * * * *